[12] United States Patent
Joyce et al.

(10) Patent No.: US 10,944,245 B2
(45) Date of Patent: Mar. 9, 2021

(54) METHOD FOR A FLEXIBLE CONNECTION SCHEME AND PROTECTIVE ENCLOSURE FOR ELECTRONICS FOR THE CHASSIS OF A JUNCTION BOX OR CHARGE SWITCH UNIT FOR AN ELECTRIC VEHICLE

(71) Applicant: Arens Controls Company, L.L.C., Arlington Heights, IL (US)

(72) Inventors: Ronald S. Joyce, Arlington Heights, IL (US); Andrew A. Vogel, Arlington Heights, IL (US); Isaac H. Park, Arlington Heights, IL (US)

(73) Assignee: ARENS CONTROLS COMPANY, LLC, Arlington Heights, IL (US)

( * ) Notice: Subject to any disclaimer, the term of this patent is extended or adjusted under 35 U.S.C. 154(b) by 0 days.

(21) Appl. No.: 16/790,852

(22) Filed: Feb. 14, 2020

(65) Prior Publication Data
US 2020/0266612 A1 Aug. 20, 2020

Related U.S. Application Data

(60) Provisional application No. 62/806,970, filed on Feb. 18, 2019.

(51) Int. Cl.
*H02B 1/26* (2006.01)
*H01R 31/06* (2006.01)
(Continued)

(52) U.S. Cl.
CPC ........... *H02B 1/26* (2013.01); *B60R 16/0239* (2013.01); *H01R 31/06* (2013.01); *H02B 1/04* (2013.01);
(Continued)

(58) Field of Classification Search
CPC ..... H02B 1/26; H05K 5/0069; B60R 16/0239
See application file for complete search history.

(56) References Cited

U.S. PATENT DOCUMENTS

| 8,629,349 B2 * | 1/2014 | Martino ................. H02G 3/123 |
| | | 174/66 |
| 9,397,450 B1 | 7/2016 | Feng et al. |

(Continued)

FOREIGN PATENT DOCUMENTS

| CN | 202205997 U | 4/2012 |
| JP | 2015-011847 A | 1/2015 |
| KR | 10-1534079 B1 | 7/2015 |

OTHER PUBLICATIONS

International Search Report dated Jun. 24, 2020 for corresponding International Application No. PCT/US2020/018215.
(Continued)

*Primary Examiner* — Robert J Hoffberg
(74) *Attorney, Agent, or Firm* — Pearne & Gordon LLP

(57) ABSTRACT

An assembly for housing electrical components of a power distribution system. The assembly includes a housing and a cover for enclosing an inner cavity of the housing. At least one connection location is on the housing and is configured for attaching one of a plurality of adapters to the housing. Each adapter includes a body having a surface engageable with the housing, an element for securing the body to the housing; and a mating feature engageable with a respective mating feature of the housing for fixing an orientation of the adapter relative to the housing.

11 Claims, 9 Drawing Sheets

(51) Int. Cl.
*H05K 5/00* (2006.01)
*B60R 16/023* (2006.01)
*H02B 1/04* (2006.01)
*H05K 5/03* (2006.01)
*B60R 16/03* (2006.01)

(52) U.S. Cl.
CPC ............ *H05K 5/0069* (2013.01); *H05K 5/03* (2013.01); *B60R 16/03* (2013.01)

(56) References Cited

U.S. PATENT DOCUMENTS

| | | | |
|---|---|---|---|
| 2017/0334375 A1 | 11/2017 | Shigyo et al. | |
| 2020/0083686 A1* | 3/2020 | Semple | H02G 3/0691 |
| 2020/0083687 A1* | 3/2020 | Semple | F16B 2/22 |

OTHER PUBLICATIONS

Written Opinion dated Jun. 24, 2020 for corresponding International Application No. PCT/US2020/018215.

* cited by examiner

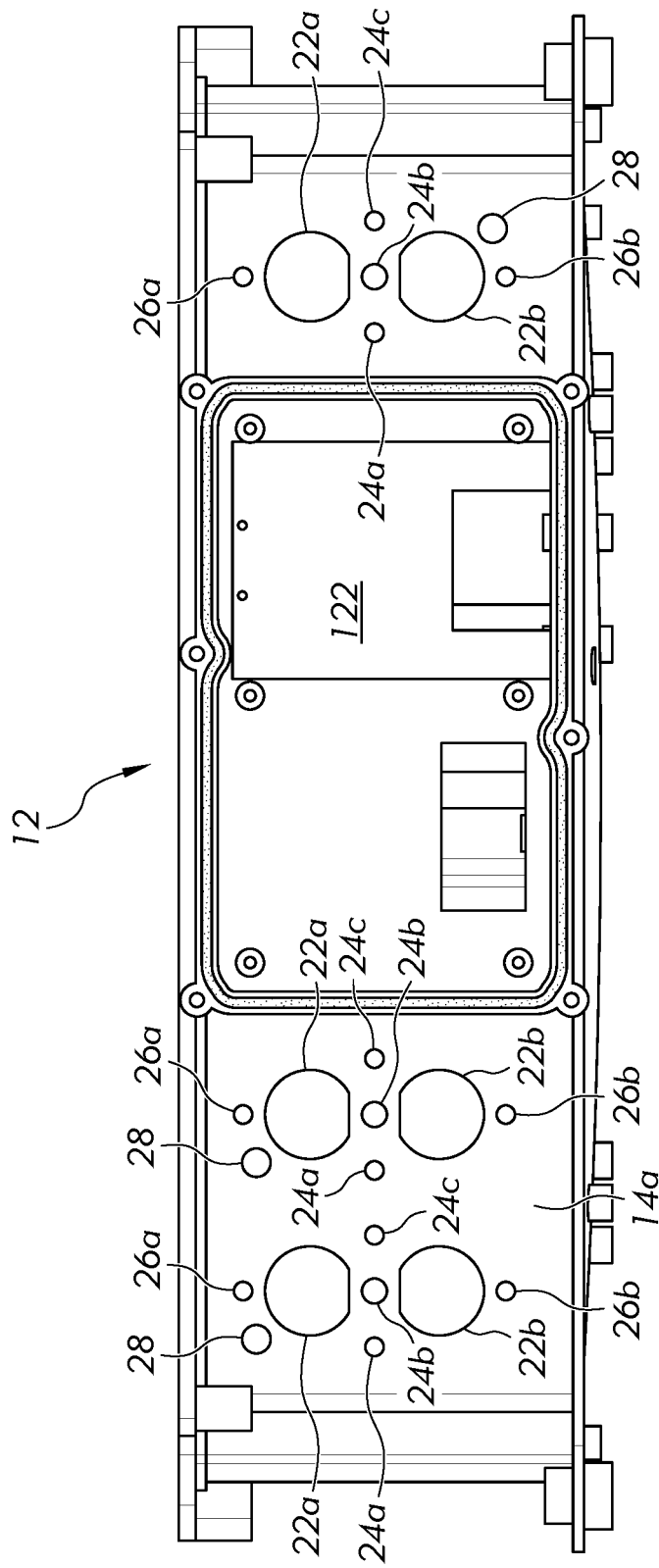

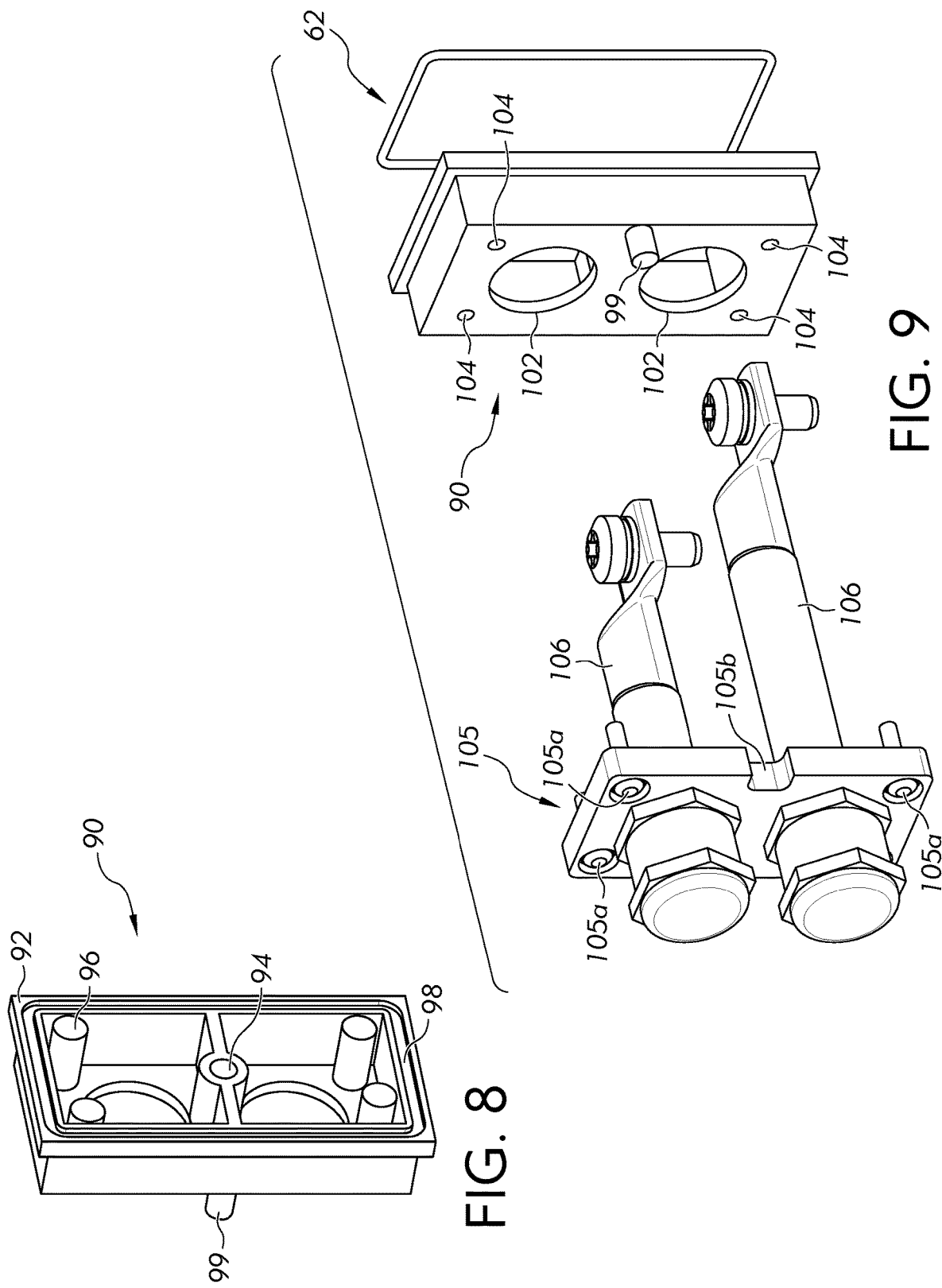

METHOD FOR A FLEXIBLE CONNECTION SCHEME AND PROTECTIVE ENCLOSURE FOR ELECTRONICS FOR THE CHASSIS OF A JUNCTION BOX OR CHARGE SWITCH UNIT FOR AN ELECTRIC VEHICLE

FIELD OF THE INVENTION

This application relates generally to a chassis for an electrical device, and more particularly, to a chassis for a power distribution assembly for use in electric trucks and buses.

BACKGROUND OF THE INVENTION

Electric vehicles, for example, electric cars, trucks and buses, conventionally include various enclosures or chassis for housing high voltage and low voltage equipment. The enclosures or chassis are configured to electrically and physically separate and/or shield the equipment therein from the environment to prevent electrostatic discharge (ESD) and physical damage to the equipment.

As the popularity of electrical vehicles increases, the variety of devices that the equipment must connect to has also increased. In many instances, these additional devices having several different connection-types or styles. Current enclosures or chassis are designed to accommodate only one connection-type or style.

In addition, the enclosures or chassis often contain both high voltage components and low voltage components, i.e., the low voltage components and the high voltage components are mounted in the same area or space. To prevent electrical damage, additional covers and/or boxes are needed to electrically separate and/or shield and protect these components.

The present invention provides a modular system for quickly and efficient connecting any one of a variety of connectors to a chassis and a means for improving the electrical and physical separation and/or shielding of low voltage components from high voltage components.

BRIEF SUMMARY OF THE INVENTION

There is provided an assembly for housing electrical components of a power distribution system. The assembly includes a housing and a cover for enclosing an inner cavity of the housing. At least one connection location is on the housing and is configured for attaching one of a plurality of adapters to the housing. Each adapter includes a body having a surface engageable with the housing, an element for securing the body to the housing; and a mating feature engageable with a respective mating feature of the housing for fixing an orientation of the adapter relative to the housing.

There is further provided an assembly for a power distribution system. The assembly includes a housing having a recess formed on a side wall of the housing. The recess is configured to receive a first electrical component. A first cover encloses the recess and electrically separates and/or shields the first electrical component from an inner cavity of the housing. A second cover encloses the inner cavity of the housing. The inner cavity is configured for receiving a second electrical component.

BRIEF DESCRIPTION OF THE DRAWINGS

FIG. 3 is a front plane view of the housing of FIG. 2;

FIG. 8 is a rear perspective view of a third adapter of the electrical assembly illustrated in FIG. 1, according to a third embodiment of the present invention;

FIG. 9 is an exploded view of the third adapter of FIG. 8 spaced from a second connector;

DESCRIPTION OF EXAMPLE EMBODIMENTS

Figure 1:
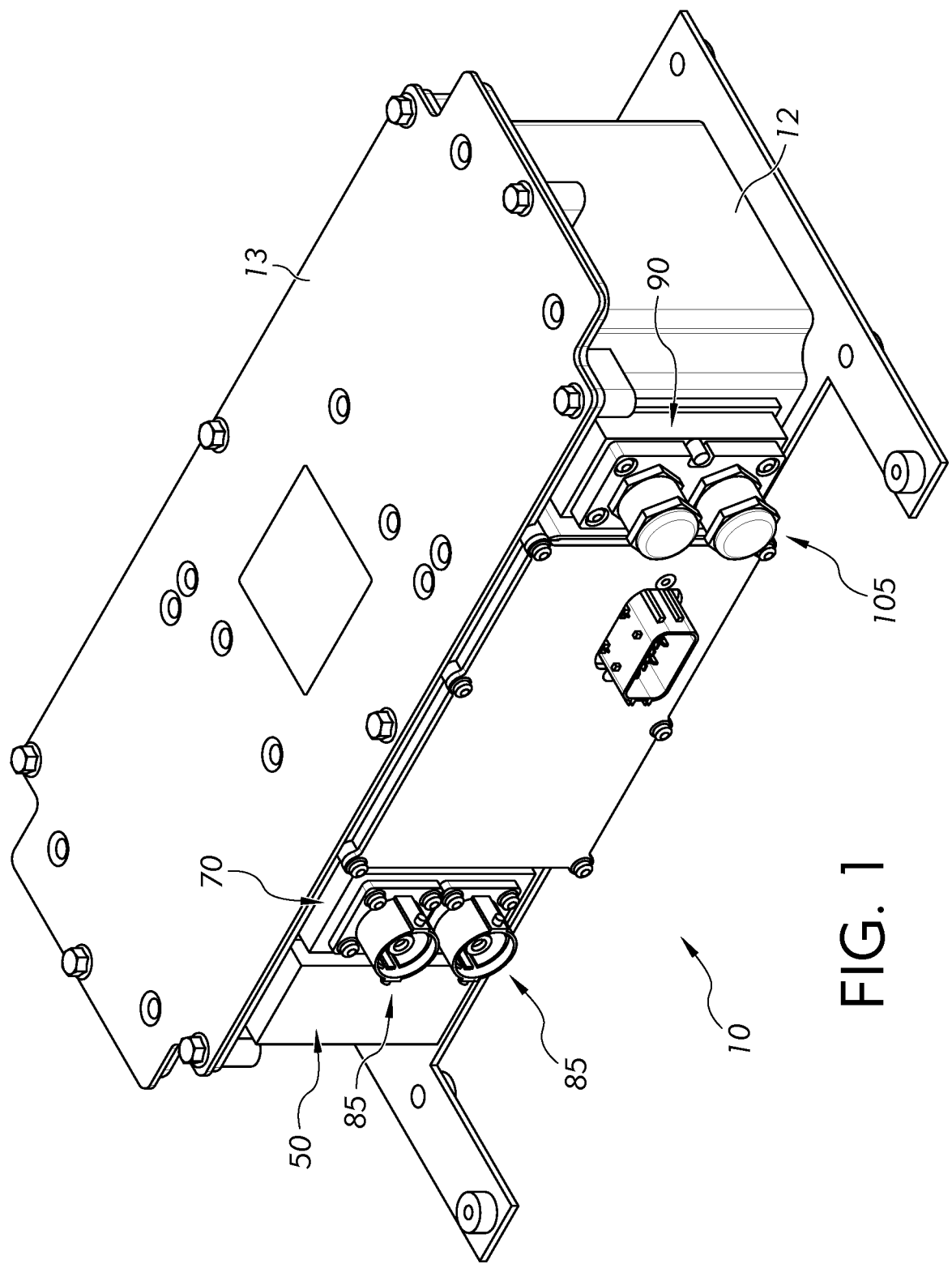
FIG. 1 is a front perspective view of an electrical assembly illustrated with three different example adapters, according the present invention.

Referring now to the drawings, FIG. 1 shows an electrical assembly, indicated generally at 10. Although the detailed description that follows relates to a power distribution assembly for an electrical truck or bus, the invention can be embodied by other electrical assemblies other than a power distribution assembly. The electrical assembly 10 includes, in general, a housing 12, a cover 13, a plurality of adapters 50, 70, 90 and first and second electrical connectors 85, 105. Although three example adapters are shown, it is contemplated that various other adapters could also be used, either alone or in combination.

Figure 2:
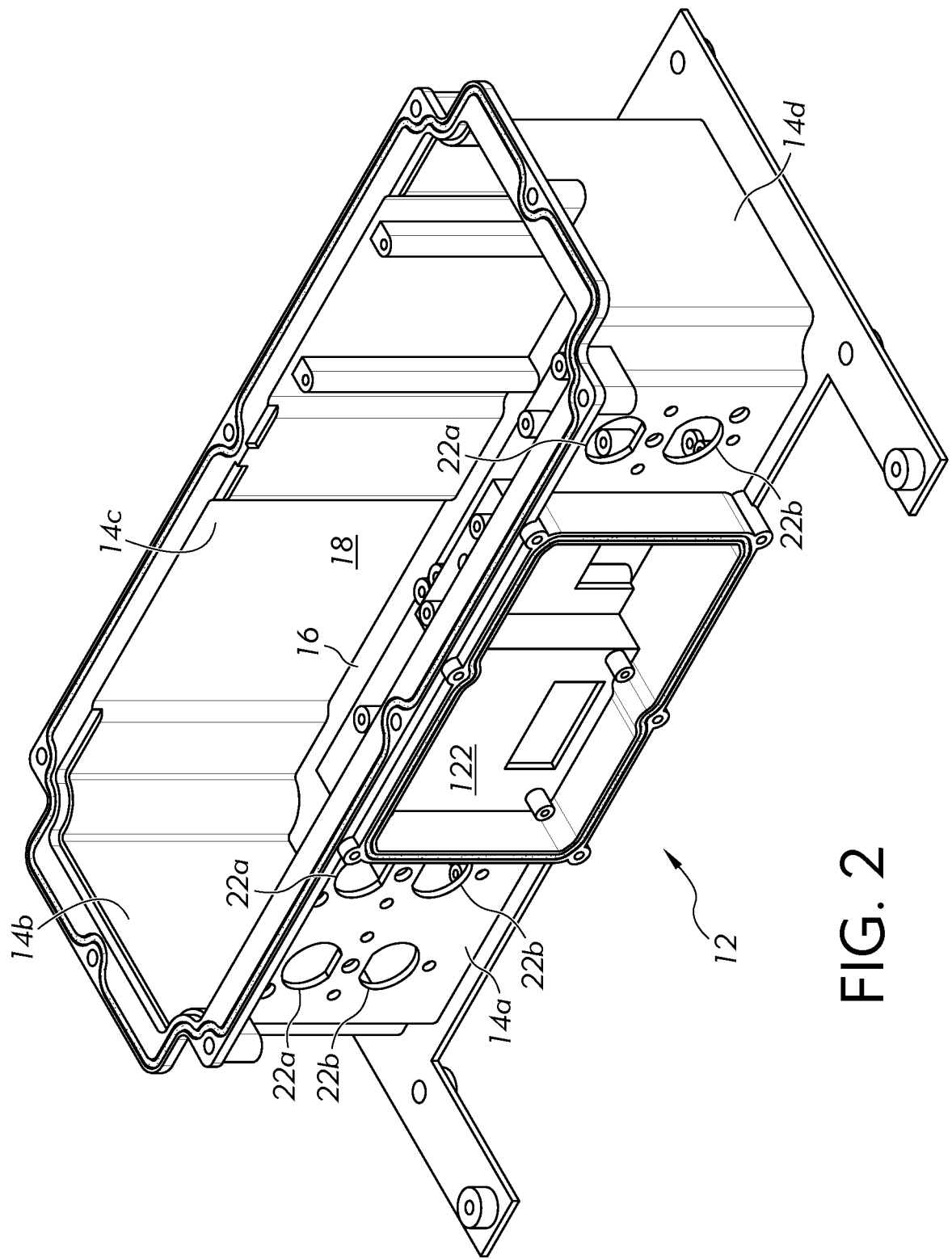
FIG. 2 is a front perspective view of a housing of the electrical assembly of FIG. 1 with various components removed.

Referring to FIG. 2, the housing 12 is illustrated with various components removed (such as cover 13) and includes side walls 14a, 14b, 14c, 14d and a bottom 16 that together define an inner cavity 18 of the housing 12. It is contemplated that the housing 12 may be made using a die-cast manufacturing process wherein a thickness of the sidewalls 14a, 14b, 14c, 14c can be minimized. A plurality of connector openings 22a, 22b extend through the side wall 14a. In the embodiment shown, the openings 22a, 22b are arranged in pairs wherein the opening 22a is an upper opening and the opening 22b is a lower opening. The openings 22a, 22b are illustrated as being D-shaped, but it is contemplated that the openings 22a, 22b may have other shapes depending on the connectors (described in detail below) that are attached to the housing 12. In the embodiment shown, two pairs of openings 22a, 22b are on a leftmost portion of the housing 12 and a single pair of openings 22a, 22b are on a rightmost portion of the housing 12. It is contemplated that any number of openings 22a, 22b may be disposed on the side wall 14a and/or additional openings 22a, 22b may be disposed on one or more of the remaining side walls 14b, 14c, 14d of the housing 12.

Figure 5:
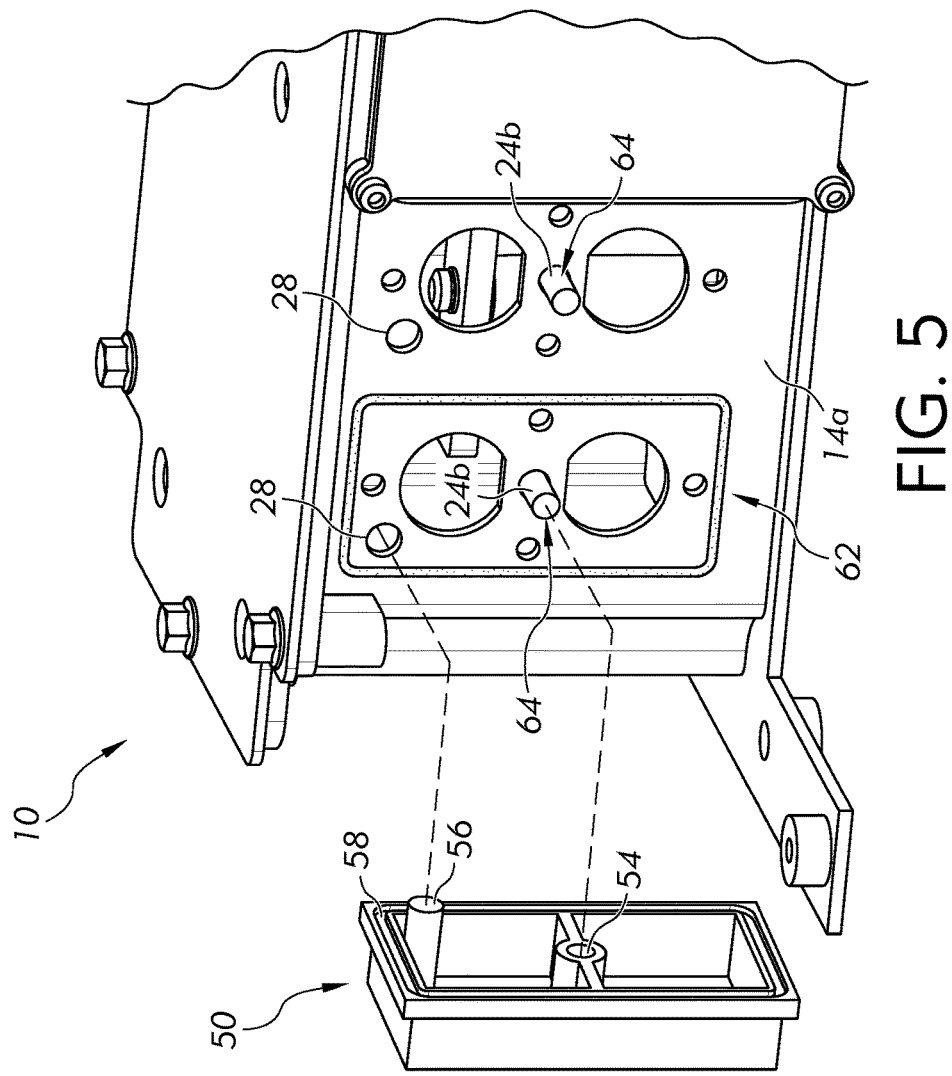
FIG. 5 is a front exploded view of the electrical assembly of FIG. 1 illustrating the first or blank adapter of FIG. 4 spaced from the housing of FIG. 1.

Referring to FIG. 3, three holes 24a, 24b, 24c extend through the side wall 14a between each pair of openings 22a, 22b. A center hole 24b of the three holes 24a, 24b, 24c is dimensioned to receive a fastener 64 (FIG. 5). An upper hole 26a is positioned above each upper opening 22a and a lower hole 26b is positioned below each lower opening 22b. Although certain hole patterns are shown and described herein, it is contemplated that various hole types, geometries, numbers, and arrangements can be used.

A locating hole 28, i.e., a mating feature, is disposed proximate the openings 22a, 22b to define a predetermine orientation of the adapters 50, 70, 90, as described in detail below. In the embodiment shown, for the first and second pair of openings 22a, 22b on the leftmost portion of the side wall 14a the locating hole 28 is disposed adjacent the upper opening 22a. For the third pair of openings 22a, 22b on the rightmost portion of the side wall 14a, the locating hole 28 is disposed adjacent the lower opening 22b. The locating hole 28 and the center hole 24b are configured for securing a chosen adapter 50, 70, 90 to the housing 12 and a predetermined orientation. Each pair of openings 22a, 22b defines a distinct connection location that is configured to mate with one of the adapters 50, 70, 90, as described in detail below.

Figure 4:
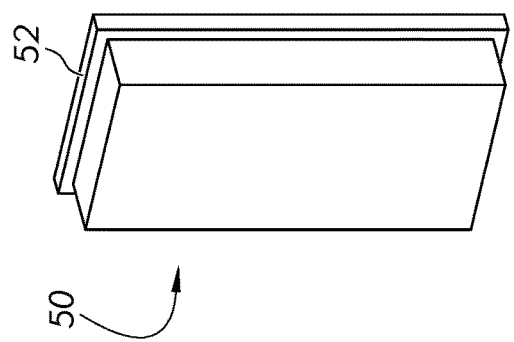
FIG. 4 is a front perspective view of a first or blank adapter of the electrical assembly illustrated in FIG. 1, according to a first embodiment of the present invention.

Referring to FIGS. 4 and 5, a first or blank adapter 50, according to a first embodiment is shown attached to the rightmost pair of openings 22a, 22b. The blank adapter 50 provides a "blank" outward face with no connector openings, and is used in a configuration where electrical connectors will not be used through the openings 22a, 22b that the blank adapter 50 is covering. In the embodiment shown, the blank adapter 50 is a generally rectangular-shaped body and includes an outwardly extending flange 52 on the sides of the blank adapter 50. Referring to FIG. 5, a threaded hole 54 extends through a central portion of a back of the blank adapter 50. A locating boss 56, i.e., a mating feature, protrudes from one corner of the back of the blank adapter 50. The threaded hole 54 and the locating boss 56 are positioned and dimensioned to align with the center hole 24b and the locating hole 28, respectively, as described in detail below.

Optionally, a peripheral groove 58 is formed in the back of the blank adapter 50. The peripheral groove 58 is configured and dimensioned to receive a seal element 62, i.e., a gasket or O-ring to define a sealed connection between the blank adapter 50 and the side wall 14a of the housing 12.

As illustrated in FIG. 5, the blank adapter 50 is mounted to the side wall 14a by aligning the locating boss 56 of the blank adapter 50 with the locating hole 28 in the side wall 14a. At the same time, the threaded hole 54 in the blank adapter 50 is aligned with the center hole 24b in the side wall 14a. The locating hole 28 is configured and positioned so that the blank adapter 50 can be secured to the side wall 14a in only one orientation.

A fastener 64 extends from the inner cavity 18 (FIG. 2) through the center hole 24b and threads into the threaded hole 54 of the blank adapter 50. As the fastener 64 is tightened, the seal element 62 (if present) is compressed between the blank adapter 50 and the side wall 14a to sealingly secure the blank adapter 50 to the side wall 14a.

Figure 7:
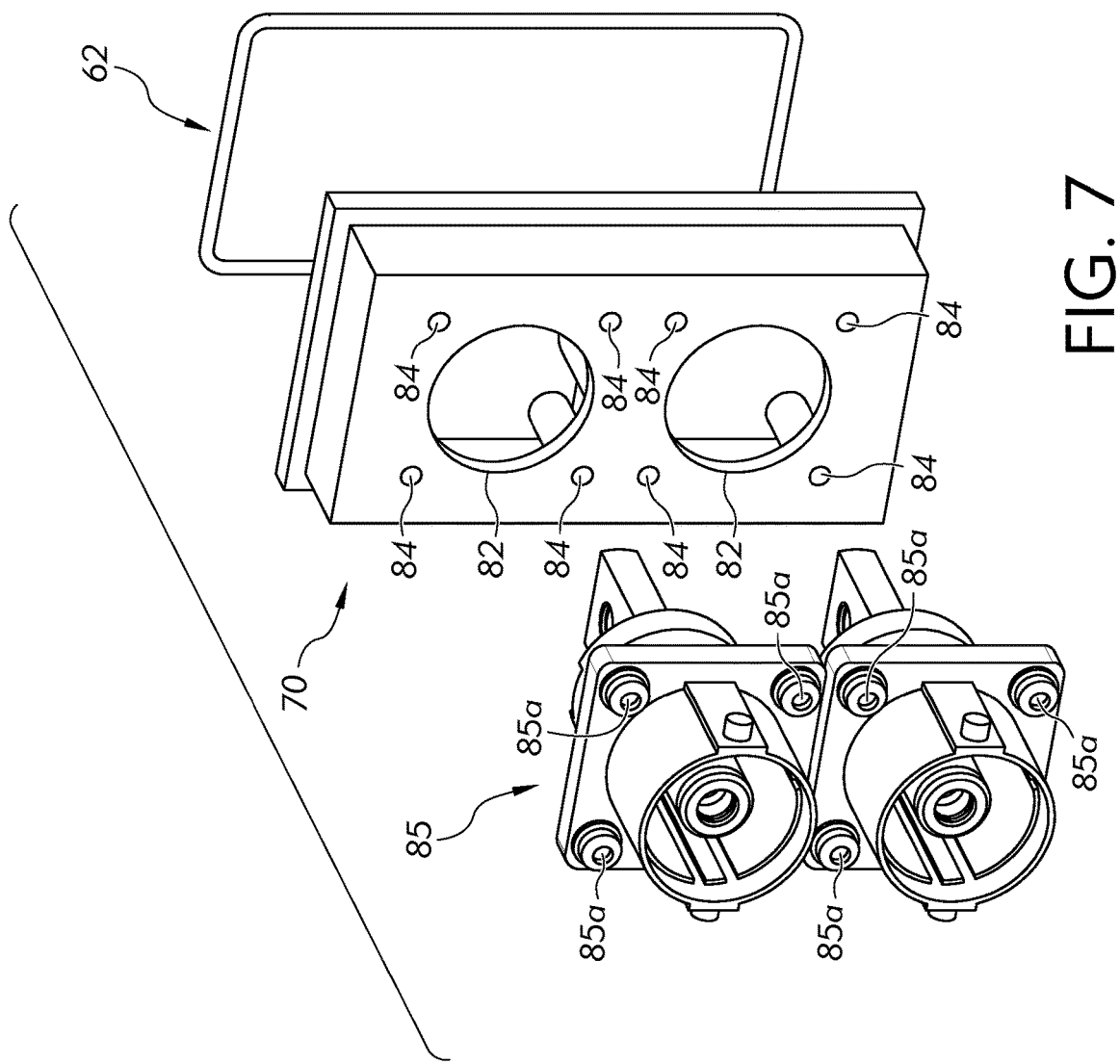
FIG. 7 is an exploded view of the second adapter of FIG. 6 spaced from a first connector.
Figure 6:
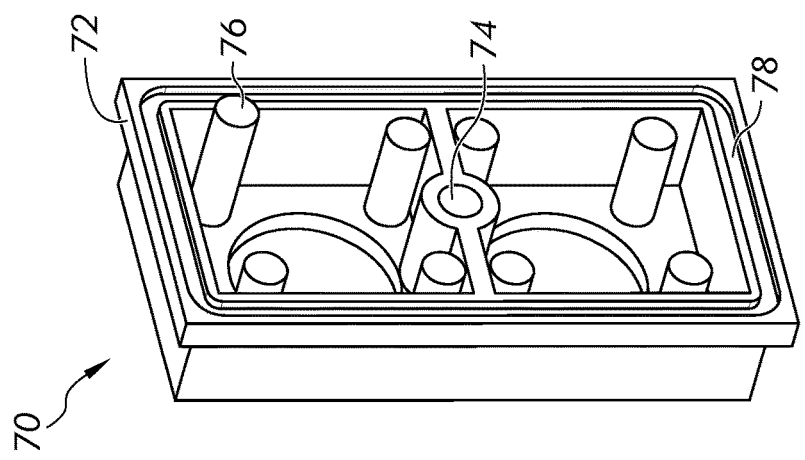
FIG. 6 is a rear perspective view of a second adapter of the electrical assembly illustrated in FIG. 1, according to a second embodiment of the present invention.

Referring to FIGS. 6 and 7, a second adapter 70, accordingly to a second embodiment is shown. Similar to the blank adapter 50, in the embodiment shown the second adapter 70 is a generally rectangular-shaped body and includes an outwardly extending flange 72 on the sides of the second adapter 70. A threaded hole 74 extends through a central portion of a back of the second adapter 70. A locating boss 76 protrudes from one corner of the back of the second adapter 70. The threaded hole 74 and the locating boss 76 are positioned and dimensioned to align with the center hole 24b (FIG. 5) and the locating hole 28 (FIG. 5), respectively, as described in detail above for the blank adapter 50. The second adapter 70 also includes a peripheral groove 78 that is formed in the back of the second adapter 70. The peripheral groove 78 is configured and dimensioned to receive the seal element 62 to sealingly secure the second adapter 70 to the side wall 14a of the housing 12 (FIG. 5).

In addition to the foregoing features, the second adapter 70 includes a pair of openings 82. Each opening 82 is dimensioned and positioned to receive a first electrical connector 85. In the embodiment shown, the first electrical connector 85 is a connector type power connection. It is contemplated that the first electrical connector 85 could be any other type of power connection for the assembly 10.

A plurality of mounting holes 84 are positioned around the openings 82 and are dimensioned and positioned to align with fasteners 85a of the first electrical connector 85. The first electrical connector 85 is secured to the second adapter 70 by threading the fasteners 85a into respective mounting holes 84 of the second adapter 70. Preferably, the plurality of mounting holes 84 are provided in an arrangement unique to only the first electrical connector 85 such that only the second adapter 70 is useable therewith.

The second adapter 70 is secured to the side wall 14a (FIG. 5) in the same manner as described above for the blank adapter 50, i.e., the locating boss 76 is inserted into the locating hole 28 (FIG. 5) and the fastener 64 (FIG. 5) is threaded into the threaded hole 74 to secure the second adapter 70 to the side wall 14a (FIG. 5) in only one orientation. For brevity, the securing of the second adapter 70 is not described in detail herein.

Referring to FIGS. 8 and 9, a third adapter 90, accordingly to a third embodiment is shown. Similar to the blank adapter 50 and the second adapter 70, in the embodiment shown the third adapter 90 is a generally rectangular-shaped body and includes an outwardly extending flange 92 on the sides of the third adapter 90. A threaded hole 94 extends through a central portion of a back of the third adapter 90. A locating boss 96 protrudes from one corner of the back of the third adapter 90. The threaded hole 94 and the locating boss 96 are positioned and dimensioned to align with the center hole 24b (FIG. 5) and the locating hole 28 (FIG. 5), respectively, as described in detail above for the blank adapter 50 and the second adapter 70. Preferably, the third adapter 90 also includes a peripheral groove 98 that is formed in the back of the third adapter 90. The peripheral groove 98 is configured and dimensioned to receive the seal element 62 to sealingly secure the third adapter 90 to the side wall 14a (FIG. 5) of the housing 12.

In addition to the foregoing features, the third adapter 90 includes a pair of openings 102. Each opening 102 is dimensioned and positioned to receive a respective lug 106 of a second electrical connector 105. In the embodiment shown, the second electrical connector 105 is a lug type power connection. It is contemplated that the second electrical connector 105 could be any other type of power connection for the assembly 10.

The third adapter 90 also includes a locating boss 99 that extends from a front of the third adapter 90. The locating boss 99 is positioned and dimensioned to be received into a mating groove 105b in the second electrical connector 105.

The locating boss 99 is provided to allow the second electrical connector 105 to be secured to the third adapter 90 in only one orientation.

A plurality of mounting holes 104 are positioned around the openings 102 and are dimensioned and positioned to align with fasteners 105a of the second electrical connector 105. The second electrical connector 105 is secured to the third adapter 90 by threading the fasteners 105a into respective mounting holes 104 of the third adapter 90. Preferably, the plurality of mounting holes 104 are provided in an arrangement unique to only the second electrical connector 105 such that only the third adapter 90 is useable therewith.

The third adapter 90 is secured to the side wall 14a (FIG. 5) in the same manner as described above for the blank adapter 50, i.e., the locating boss 96 is inserted into the locating hole 28 (FIG. 5) and the fastener 64 (FIG. 5) is threaded into the threaded hole 94 to secure the third adapter 90 to the side wall 14a (FIG. 5) in only one orientation. For brevity, the securing of the third adapter 90 is not described in detail herein.

Figure 10A:
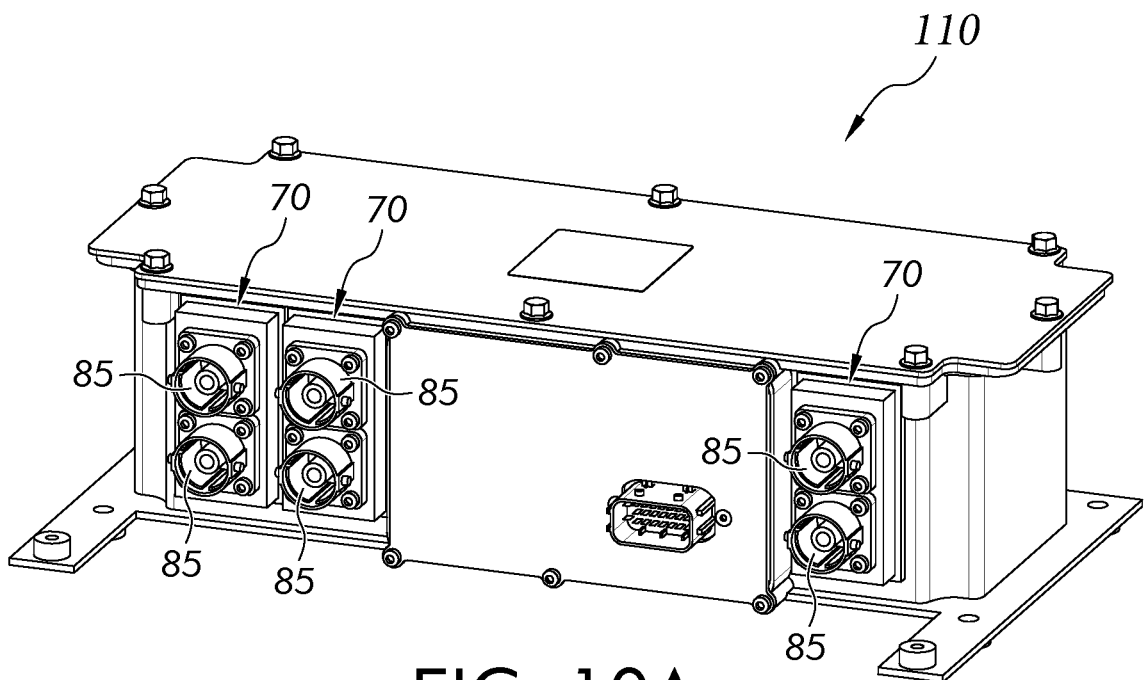
FIG. 10A is a front perspective view of the electrical assembly of FIG. 1 with the adapters according to the second embodiment of FIG. 6.
Figure 10B:
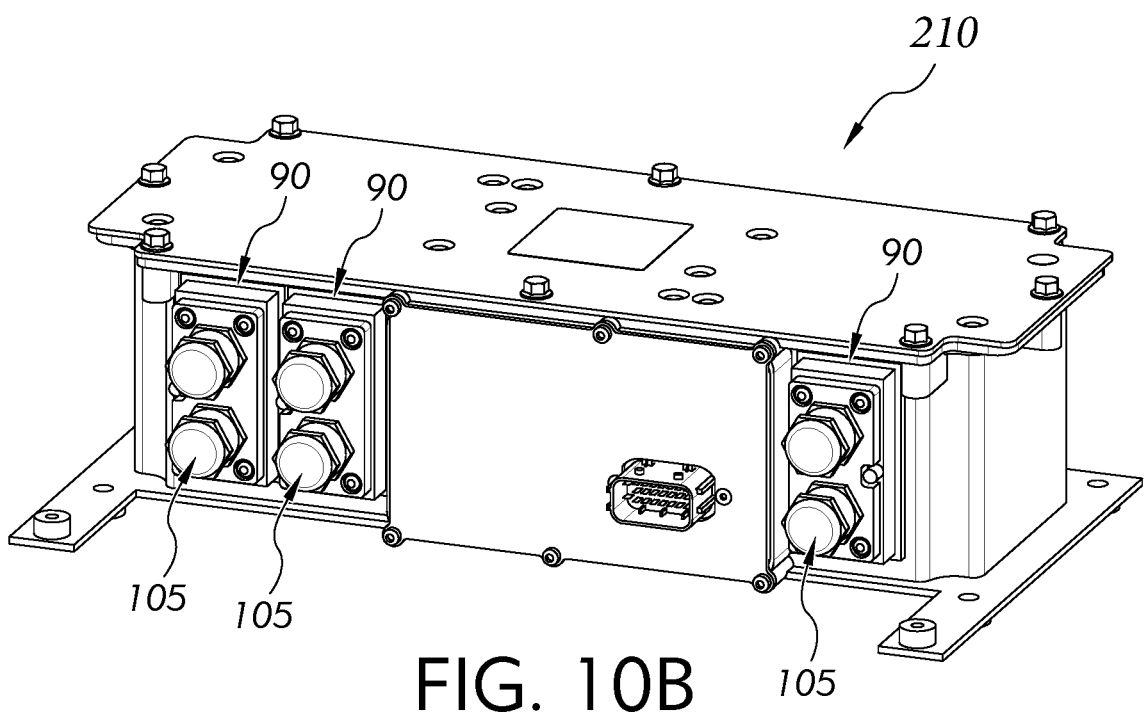
FIG. 10B is a front perspective view of the electrical assembly of FIG. 1 with the adapters according to the third embodiment of FIG. 8.

In the example illustrated in FIG. 1, the assembly 10 includes one blank adapter 50, one second adapter 70 and one third adapter 90. It is contemplated that any combination of adapters 50, 70, 90 could be used on assembly 10. For example, FIG. 10A illustrates an assembly 110 that includes three second adapters 70 (for receiving six first electrical connectors 85). FIG. 10B illustrates an assembly 210 that includes three third adapter 90 (for receiving three second electrical connectors 105).

Figure 11:
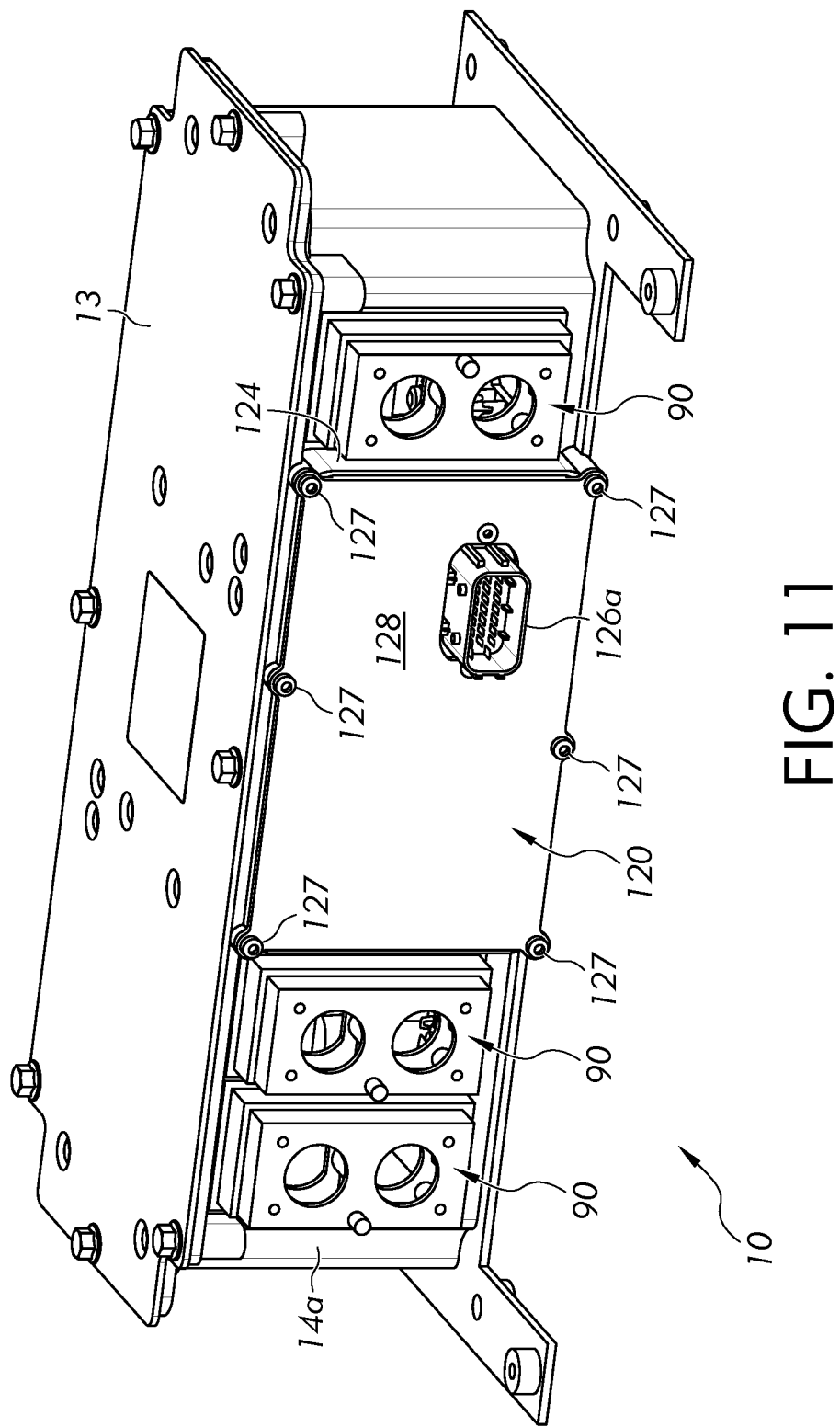
FIG. 11 is a front perspective of the electrical assembly of FIG. 1, illustrating a low-voltage compartment of the assembly of FIG. 1.
Figure 12:
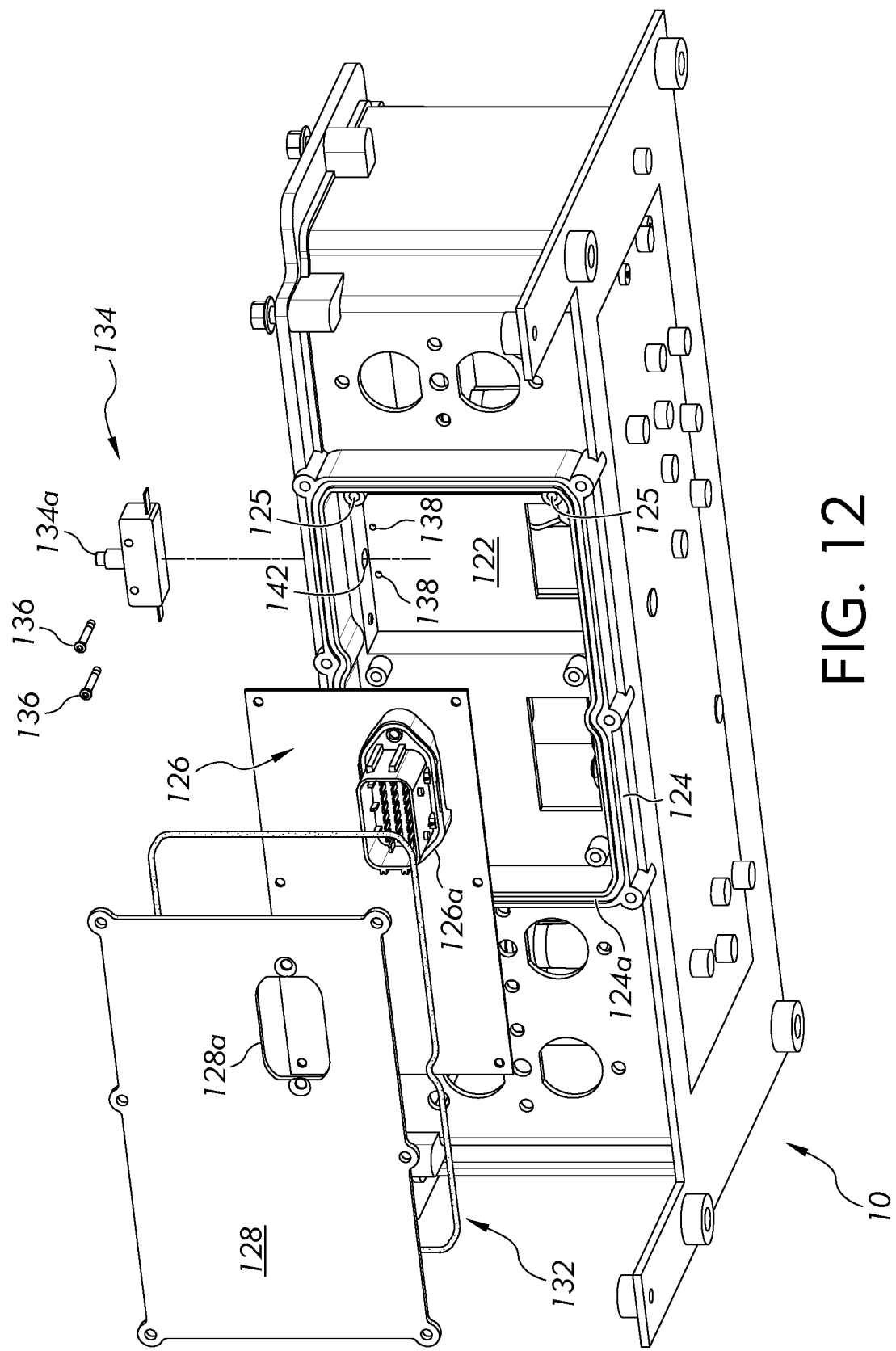
FIG. 12 is front exploded view of the low-voltage compartment of FIG. 11, illustrating various components spaced from the housing of FIG. 2.

Referring to FIGS. 11 and 12, the assembly 10 may also include a low-voltage compartment 120 that is integral with the side wall 14a of the housing 12. It is to be understood that the low-voltage compartment 120 may be used together with the adapters 50, 70, 90 described above, or may be separately used by itself. The low-voltage compartment 120 is configured to receive electrical components, e.g., a printed circuit board (PCB) 126 and a high-voltage interlock loop (HVIL) switch 134, as described in detail below. The low-voltage compartment 120, in general, includes a recess 122 (FIG. 12) that extends into the housing 12 and that is defined by an outwardly extending wall 124 and a cover 128. Preferably the low-voltage compartment 120 is separated by a wall or the like from the inner cavity 18 (FIG. 2) of the housing 12 that contains the high-voltage electrical components. The recess 122 and the cover 128 are configured to electrically and physically separate and/or shield the PCB 126 and the HVIL switch 134 from the external environment and from the high-voltage components (not shown) in the inner cavity 18 (FIG. 2) of the assembly 10.

In the embodiment shown in FIG. 12, the recess 122 is generally rectangular-in-shape and includes a plurality of mounting bosses 125 for securing the PCB 126 into the recess 122. As illustrated, the PCB 126 includes a connector 126a for communication with an external device (not shown).

The cover 128 of the low-voltage compartment 120 is secured to a periphery of the wall 124 to enclose the recess 122. A plurality of fasteners 127 (FIG. 11) may be provided for securing the cover 128 to the wall 124. The cover 128 may include an opening 128a for allowing the connector 126a of the PCB 126 to extend out of the recess 122. Optionally, a gasket or O-ring 132 is positioned between a back surface of the cover 128 and a groove 124a formed in the wall 124 to define a seal between the cover 128 to the wall 124.

The HVIL switch 134 may be disposed within the recess 122. The HVIL switch 134 is configured to detect when the cover 13 (FIG. 11) of the assembly 10 is removed to expose the high-voltage electrical components. Upon detection of the cover 13 (FIG. 11) being removed, the HVIL switch 134 may provide a signal to the PCB 126 (or alternatively, a signal to the PCB 126 may be interrupted) and the PCB 126, in turn, causes power to the high-voltage components in the inner cavity 18 (FIG. 2) of the assembly 10 to be interrupted. In this respect, the HVIL switch 134 is a safety switch that is configured to prevent accidental injury to a user.

Fasteners 136 may be provided for securing the HVIL switch 134 to mounting holes 138 in the recess 122. A sensing element 134a of the HVIL switch 134 extends through a mating hole 142 of the recess 122 for allowing the sensing element 134a to be in a position to detect removal or other movement of the cover 13 (FIG. 11). Preferably, the sensing element 134a is a spring-biased contact switch that abuts a bottom surface of the cover 13 (FIG. 11) when the cover 13 is in an installed condition.

As discussed above, the PCB 126 and the HVIL switch 134 are secured to portions of the recess 122. It is also contemplated that these components could be mounted to a bracket (not shown) external to the recess 122. This bracket will allow these components to be assembled in a sub-assembly and then inserted, as a unitary unit into the recess 122. In this respect, any electrical connections between the PCB 126 and the HVIL switch 134 can be made in a clean, controlled environment and then tested prior to being inserted into the recess 122.

In the embodiments shown, threaded fasteners are illustrated as connecting the adapters 50, 70, 90 to the housing 12. It is contemplated that other means of fastening may also be used to secure to these adapters 50, 70, 90 to the housing 12, including but not limited to, adhesives, snap connections, staking and welding.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. An assembly for housing electrical components of a power distribution system, the assembly comprising
  a housing;
  an inner cavity of the housing configured to receive at least one electrical component;
  a first cover for enclosing the inner cavity of the housing;
  a recess formed on a side wall of the housing, the recess configured to receive an interlock loop switch, the side wall of the housing electrically separates and/or shields the interlock loop switch from the inner cavity of the housing, wherein the interlock loop switch detects when the first cover is removed and causes power to the at least one electrical component to be interrupted;
  a second cover for enclosing the recess on the side wall of the housing;
  at least one connection location on the housing configured for attaching one or more of a plurality of adapters to the housing; and
  each adapter of the plurality of adapters comprising:
    a body disposed on an outside of the housing and having a surface engageable with the housing;
    a means for securing the body to the housing; and
    a mating feature engageable with a respective mating feature of the housing for fixing an orientation of the adapter relative to the housing.

2. The assembly of claim 1, wherein the means for securing the body to the housing is a threaded hole configured to receive a threaded fastener.

3. The assembly of claim 1, wherein the mating feature is a boss extending from the surface of the body of the adapter and the respective mating feature is an opening configured to receive the boss.

4. The assembly of claim 1, further comprising:
a second mating feature extending from another surface of the body of the adapter, the second mating feature configured for engaging a respective second mating feature on an electrical connector for fixing an orientation of the electrical connector relative to the adapter.

5. The assembly of claim 1, wherein a seal element is disposed between the surface of the body and the housing.

6. The assembly of claim 1, wherein the adapter includes at least one hole configured to receive an electrical connector.

7. The assembly of claim 1, wherein a surface of the adapter facing away from the housing is free of openings.

8. The assembly of claim 1, wherein the recess being further configured to receive a printed circuit board.

9. An assembly for a power distribution system, the assembly comprising
a housing, the housing including:
a recess formed on a side wall of the housing, the recess configured to receive at least one first electrical component, the side wall of the housing electrically separates and/or shields the at least one first electrical component from an inner cavity of the housing; and
a first cover for enclosing the recess formed on the side wall of the housing;
a second cover for enclosing the inner cavity of the housing, the inner cavity configured for receiving at least one second electrical component,
a plurality of connection locations on the side wall of the housing, each of the connection locations configured for attaching one of a plurality of adapters to the housing;
each of the plurality of adapters comprising:
a body have a surface engageable with the side wall of the housing;
a means for securing the body to the side wall of housing; and
a mating feature engageable with a respective mating feature of side wall of the housing for fixing an orientation of the adapter relative to side wall of the housing,
wherein each adapter is a same or different from at least one other of the plurality of adapters.

10. The assembly of claim 9, wherein the first electrical component is a low voltage component including at least one of a printed circuit board or an interlock loop switch and the second electrical component is a high-voltage component, the high voltage component configured to operate at a higher voltage than the low voltage component.

11. The assembly of claim 9, wherein at least two of the plurality of adapters are a same.

* * * * *